US012595374B2

(12) United States Patent
Kimura et al.

(10) Patent No.: US 12,595,374 B2
(45) Date of Patent: Apr. 7, 2026

(54) THERMAL SPRAY MATERIAL

(71) Applicant: Shin-Etsu Chemical Co., Ltd., Tokyo (JP)

(72) Inventors: Yuji Kimura, Echizen (JP); Yasushi Takai, Echizen (JP); Shigeyuki Nakamura, Echizen (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 880 days.

(21) Appl. No.: 17/791,598

(22) PCT Filed: Jan. 13, 2021

(86) PCT No.: PCT/JP2021/000859
§ 371 (c)(1),
(2) Date: Jul. 8, 2022

(87) PCT Pub. No.: WO2021/145341
PCT Pub. Date: Jul. 22, 2021

(65) Prior Publication Data
US 2023/0072803 A1 Mar. 9, 2023

(30) Foreign Application Priority Data

Jan. 16, 2020 (JP) ................................. 2020-004920

(51) Int. Cl.
| | |
|---|---|
| *C09D 1/00* | (2006.01) |
| *C09D 5/03* | (2006.01) |
| *C09D 5/08* | (2006.01) |
| *C23C 4/11* | (2016.01) |
| *H01J 37/32* | (2006.01) |

(52) U.S. Cl.
CPC .............. *C09D 1/00* (2013.01); *C09D 5/031* (2013.01); *C09D 5/084* (2013.01); *C23C 4/11* (2016.01); *H01J 37/32495* (2013.01)

(58) Field of Classification Search
None
See application file for complete search history.

(56) References Cited

U.S. PATENT DOCUMENTS

| | | |
|---|---|---|
| 2015/0096462 A1 | 4/2015 | Fukagawa et al. |
| 2017/0114440 A1 | 4/2017 | Takai et al. |
| 2018/0327892 A1 | 11/2018 | Wu et al. |
| 2019/0127280 A1 | 5/2019 | Zhan et al. |
| 2019/0264316 A1* | 8/2019 | Takai .......................... C23C 4/11 |
| 2019/0352761 A1 | 11/2019 | Takai |

FOREIGN PATENT DOCUMENTS

| | | |
|---|---|---|
| JP | 2014-009361 A | 1/2014 |
| JP | 2017-082325 A | 5/2017 |
| JP | 2018-184664 A | 11/2018 |
| JP | 2018-190985 A | 11/2018 |
| JP | 2019-203192 A | 11/2019 |

OTHER PUBLICATIONS

International Search Report dated Mar. 9, 2021, issued in counterpart Application No. PCT/JP2021/000859, with English translation (5 pages).
Written Opinion dated Mar. 9, 2021, issued in counterpart Application No. PCT/JP2021/000859 (3 pages).
Office Action dated Aug. 3, 2024, issued in counterpart CN Application No. 202180009512.2. (10 pages).
You Fang-Tian, et al., Systematic Synthesis of Ammonium Rare Earth Fluorides and the Luminescent Properties of NH4GdF4: Eu, Chinese Journal of Inorganic Chemistry, vol. 18, No. 1, 2002, with partial English translation; Cited in CN Office Action dated Aug. 3, 2024.

* cited by examiner

*Primary Examiner* — Tanisha Diggs
(74) *Attorney, Agent, or Firm* — WHDA, LLP

(57) ABSTRACT
This thermal spray material including composite particles containing an yttrium oxide and an ammonium yttrium fluoride complex salt is used to form a thermal spray film comprising yttrium oxyfluoride formed by thermal-spraying in the air. When the thermal spray film is formed through thermal-spraying in the air by using the thermal spray material of the present invention, the loss of fluorine from the thermal spraying material during thermal-spraying is reduced, and a thermal spray film containing yttrium oxyfluoride can be formed by controlling a composition, so that a thermal spray film having a desired composition, particularly a desired F/Y, can be easily formed.

4 Claims, 3 Drawing Sheets

POSITION [° 2THETA] (COPPER (Cu))

POSITION [° 2THETA] (COPPER (Cu))

THERMAL SPRAY MATERIAL

TECHNICAL FIELD

The present invention relates to a thermal spray material that can form a thermal sprayed film having superior corrosion resistance and used as an inner surface coating and others of a semiconductor manufacturing device.

BACKGROUND ART

Since an inner surface of a dry etching device used for an etching process of semiconductors is exposed to a high reactive fluorine-based plasma or oxygen-based plasma, if a common-used material such as quarts glass, alumina, alumite and the like is used as it is, surface corrosion proceeds, and particles generated by the surface corrosion cause defects in fine circuit of the semiconductors.

To this circumstance, conventionally, a thermal sprayed film formed from a thermal spray material composed of an yttrium oxyfluoride that has corrosion resistance to various types of plasma is presented, for example, in Patent Document 1 (JP-A 2014-009361). Further, with consideration for oxidation during atmospheric plasma spraying, a thermal sprayed film containing an yttrium oxyfluoride formed stably by a thermal spray material of an yttrium oxyfluoride mixed with an yttrium fluoride is presented in Patent Document 2 (JP-A 2017-082325).

PRIOR ART DOCUMENTS

Patent Documents

Patent Document 1: JP-A 2014-009361
Patent Document 2: JP-A 2017-082325

SUMMARY OF INVENTION

Technical Problem

Recently, it has been required that a composition of the thermal sprayed film is controlled to a desired composition according to a type of gas used in dry etching. For example, when a coating of YOF (F/Y=1) is used under an etching environment with a large amount of fluorine-based gas and a small amount of oxygen-based gas, chemical change to $Y_5O_4F_7$ (F/Y=1.4) easily proceeds and causes generation of particles, thus a coating of $Y_5O_4F_7$ is preferably used in this case. On the other hand, in an etching environment with a small amount of fluorine-based gas and a large amount of oxygen-based gas, a coating of YOF (F/Y=1) is preferably used in this case because chemical change from $Y_5O_4F_7$ (F/Y=1.4) to YOF (F/Y=1) easily proceeds. Further, there is also a demand for a coating having a composition in which a certain amount of yttrium fluoride ($YF_3$) is mixed with an yttrium oxyfluoride to increase acid resistance.

The thermal spray material described in Patent Document 1 is an yttrium oxyfluoride, thus it is difficult to obtain stably a thermal sprayed film having a desired composition because the composition widely varies by oxidation in thermal spraying in air. Further, a thermal sprayed film having a desired composition may be obtained from the thermal spray material described in Patent Document 2, however, it cannot set simply the composition of the thermal spray material so as to obtain the desired composition in the resulting thermal sprayed film because the proportion of fluorine decreases by no small effect of compositional variation due to oxidation in thermal spraying in air. Therefore, there is a demand for a thermal spray material that can easily form a thermal sprayed film having a desired composition, particularly a desired molar ratio of F and Y (F/Y), at the composition, in forming the thermal sprayed film containing an yttrium oxyfluoride by thermal spraying in air.

The present invention was carried out in light of the above circumstances, and an object of the present invention is to provide a thermal spray material that can easily form a thermal sprayed film containing an yttrium oxyfluoride at a desired composition, particularly a desired molar ratio of F and Y (F/Y) in forming the thermal sprayed film containing an yttrium oxyfluoride by thermal spraying in air.

Solution to Problem

In order to achieve the object, the inventors have conducted earnestly investigations, and as a result, the inventors found that when a thermal sprayed film is formed by thermal spraying in air with using, as a thermal spray material, composite particles containing an yttrium oxide and a double salt of ammonium yttrium fluoride, the thermal sprayed film that contains an yttrium oxyfluoride and has a F/Y equivalent to that of the thermal spray material can be easily formed.

Accordingly, the present invention provides the following thermal spray material.

[1]. A thermal spray material comprising composite particles comprising an yttrium oxide and a double salt of ammonium yttrium fluoride.

[2]. The thermal spray material of [1] wherein the double salt of ammonium yttrium fluoride is $NH_4Y_2F_7$.

[3]. The thermal spray material of [1] or [2] wherein a molar ratio of F to Y (F/Y) in the composite particles is not less than 1 and less than 3.

[4]. The thermal spray material of any one of claims [1] to [3] having an average particle size ($D_{50}$) of not less than 1 μm and not more than 100 μm.

Advantageous Effects of Invention

When a thermal sprayed film is formed by thermal spraying in air with using the thermal spray material of the present invention, fluorine loss from thermal spraying material during thermal spraying is few, and a thermal sprayed film containing an yttrium oxyfluoride under controlling composition can be obtained, thus a thermal sprayed film having a desired composition, particularly a desired molar ratio of F and Y (F/Y) can be easily formed. Therefore, a thermal sprayed film containing an yttrium oxyfluoride can be formed at a desired composition according to a type of gas in dry etching that is applied to the thermal sprayed film. Further, according to the present invention, a thermal sprayed film having higher corrosion resistance can be effectively formed in accordance with a type of gas used in dry etching, thus stability of the etching process can be improved by the thermal sprayed film that is adapted to a type of gas to be used and has a composition being hard to be caused chemical change during etching.

DESCRIPTION OF EMBODIMENTS

Figure 1:
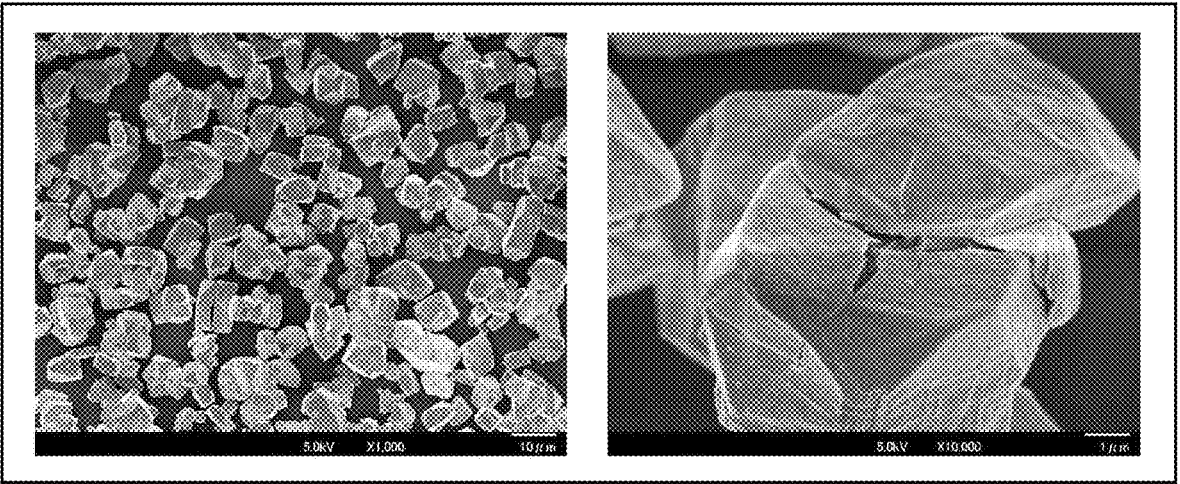
FIG. 1 It is a SEM image of the yttrium oxide used in Example 1.

The present invention is described in detail below.

A thermal spray material of the present invention includes composite particles containing an yttrium oxide and a double salt of ammonium yttrium fluoride. A thermal sprayed film containing an yttrium oxyfluoride, particularly, a crystal phase of the yttrium oxyfluoride can be formed by thermal spraying in air with using the thermal spray material of the present invention. Atmospheric Plasma Spraying (APS) or Suspension Plasma Spraying in air (SPS) may be applied as the thermal spraying in air. In the present invention, examples of the yttrium oxyfluorides include YOF (F/Y=1/1), $Y_5O_4F_7$ (F/Y=7/5(=1.4)), $Y_6O_5F_8$ (F/Y=8/6(=approx. 1.33)), $Y_7O_6F_9$ (F/Y=9/7(=approx. 1.29)) and the like, and the yttrium oxyfluoride may be a mixture.

It is considered that the action of the composite particles contained in the thermal spray material of the present invention is as follows, however, not limited thereto. A decomposition temperature of the double salt of ammonium yttrium fluoride is about 300° C. Therefore, it is considered that when the composite particles are supplied into a plasma jet at several thousand ° C. during thermal spraying, the double salt of ammonium yttrium fluoride is instantaneously decomposed and dissociated, to emit HF gas and $NH_3$ gas. Further, it is considered that the generated HF gas instantaneously reacts with an yttrium oxide that presents at the close vicinity of the portion at which the double salt of ammonium yttrium fluoride was presented, the reaction product is melted to form an yttrium oxyfluoride, and on the other hand, $NH_3$ gas that has property of burning at high temperatures consumes oxygen in the surrounding air to prevent oxidation of the yttrium oxyfluoride.

Examples of the double salts of ammonium yttrium fluoride include $NH_4Y_2F_7$, $NH_4Y_3F_{10}·H_2O$ (($YF_3$)$_3$ $NH_4F·H_2O$), and the like. $NH_4Y_2F_7$ that has the higher $NH_4$ content is preferable from the viewpoint of further suppressing the oxidation when using the thermal spray material during thermal spraying in air.

The composite particles of the present invention preferably contain the yttrium oxide and the double salt of ammonium yttrium fluoride as crystal phases, and may contain other components, as crystal phases, as long as a small amount, however, preferable crystal phases included in the composite particles of the present invention substantively consist of the yttrium oxide and the double salt of ammonium yttrium fluoride.

A molar ratio of F and Y (F/Y) in the composite particles of the present invention is preferably not less than 1, more preferably not less than 1.2 from the viewpoint of suppressing generation of an yttrium oxide in thermal sprayed film. On the other hand, an upper limit of the molar ratio of F and Y (F/Y) is preferably less than 3, more preferably not more than 2.9 from the viewpoint of avoiding deterioration of working environment caused by increase of excess HF gas that does not contribute to the reaction.

An average particle size ($D_{50}$) of the thermal spray material of the present invention is preferably not less than 1 μm, more preferably not less than 3 μm, even more preferably not less than 10 μm from the viewpoint of avoiding clogging the thermal spray material in a supply line to a plasma jet due to aggregation of particles. Further, the average particle size ($D_{50}$) of the composite particles is preferably not more than 100 μm, more preferably not more than 60 μm from the viewpoint of easy melting in a plasma jet to obtain a good material yield or from the viewpoint of avoiding formation of a rough coating surface. In the present invention, a volume-based average particle size (median diameter) measured by laser diffraction method can be applied to the average particle size ($D_{50}$).

A content of the composite particles containing the yttrium oxide and the double salt of ammonium yttrium fluoride in the thermal spray material is preferably not less than 50 wt %, more preferably not less than 90 wt %. In this case, for example, yttrium fluoride ($YF_3$) particles may be contained in the thermal spray material as a part or the whole of the remainder of the composite particles of the present invention. More preferably, the thermal spray material consists of the composite particles containing the yttrium oxide and the double salt of ammonium yttrium fluoride, i.e., the content of the composite particles containing the yttrium oxide and the double salt of ammonium yttrium fluoride in the thermal spray material is 100 wt %.

As a concrete example of a configuration of the composite particles, composite particles of the yttrium oxide and the double salt of ammonium yttrium fluoride (first embodiment) that have a form in which particles of the yttrium oxide (preferably particles of crystal) and particles of the double salt of ammonium yttrium fluoride (preferably particles of crystal) are dispersed each other in the respective particle are exemplified, however, not limited thereto. Further, composite particles of the yttrium oxide and the double salt of ammonium yttrium fluoride (second embodiment) that have a form in which particles of the double salt of ammonium yttrium fluoride (preferably particles of crystal) are dispersed at the surface or interior of the particles of the yttrium oxide (preferably particles of crystal) being a matrix are also exemplified.

The composite particles of the present invention are scarcely loss of fluorine in both of preparing the composite particles and forming a thermal sprayed film from the composite particles by thermal spraying in air, thus the composition, particularly the molar ratio of F/Y, of a raw material used in preparing the composite particles may be almost the same as that of the thermal sprayed film to be formed with using the thermal spray material.

The composite particles of the first embodiment can be prepare, for example, by a method (mixing method) in which the particles of the yttrium oxide (preferably particles of crystal) and particles of the double salt of ammonium yttrium fluoride (preferably particles of crystal) are mixed and integrated. Examples of such composite particles include granulated particles which are granulated from a mixture of the yttrium oxide and the particles of the double salt of ammonium yttrium fluoride. The mixing method is suitable for preparing the composite particles in which the double salt of ammonium yttrium fluoride is $NH_4Y_3F_{10}·H_2O$.

A commercial product may be used for the particles of the yttrium oxide. Here, an average particle size ($D_{50}$) of the particles of the yttrium oxide is preferably not less than 0.1 μm, and is preferably not more than 1 μm. On the other hand, in the case that the ammonium yttrium fluoride is $NH_4Y_3F_{10}·H_2O$, the particles of the double salt of ammonium yttrium fluoride can be prepared by mixing an aqueous solution of yttrium nitrate and an aqueous solution of ammonium fluoride, and precipitating a deposit. The deposit can be collected as the particles of the double salt of ammonium yttrium fluoride by preforming filtration, washing with water, drying, and others, appropriately. Here, an average particle size ($D_{50}$) of the particles of the double salt of ammonium yttrium fluoride is preferably not less than 0.1 μm, and is preferably not more than 1 μm.

The granulated particles can be obtained by mixing the particles of the yttrium oxide and the double salt of the ammonium yttrium fluoride into a dispersion medium such as water to prepare a slurry, and granulating and drying by a spray dryer. In the case of preparing the composite particles by the mixing method, heating at a high temperature causes a reaction of the yttrium oxide and the double salt of ammonium yttrium fluoride, thus the drying must not be performed at a temperature of not less than 200° C., however, drying at a low temperature, for example, drying at a temperature of less than 200° C. to remove water is applicable. The average particle size ($D_{50}$) of the composite particles can be adjusted by varying the conditions of granulating.

The composite particles of the second embodiment can be prepare, for example, by a method (crystallization method) in which the particles of the yttrium oxide are mixed into an aqueous solution containing fluorine ions and ammonium ions, and reacted to crystallize the double salt of ammonium yttrium fluoride on the surface or the surface and interior of the particles of the yttrium oxide. The particles on which the double salt of ammonium yttrium fluoride have been precipitated can be collected as the composite particles by preforming filtration, washing with water, drying, and others, appropriately. The crystallization method is suitable for preparing the composite particles in which the double salt of ammonium yttrium fluoride is $NH_4Y_2F_7$.

In addition, from the viewpoint of preparing the composite particles including the double salt of ammonium yttrium fluoride, it is possible to prepare the composite particles with using an yttrium compound that thermally decomposes into an oxide (for example, a carbonate, a hydroxide, an organic acid salt such as oxalate, or the like, of yttrium) instead of the yttrium oxide. Even in the case of the yttrium compound other than the yttrium oxide, the reaction to form the double salt of ammonium yttrium fluoride may occur by the reaction with fluorine ions and ammonium ions. In this case, the composite particles are formed as particles containing the yttrium compound and the double salt of ammonium yttrium fluoride.

Such composite particles may be used as a thermal spray material, however, particles of the yttrium compound other than the yttrium oxide include fine particles in many cases, and during the precipitation of the double salt of ammonium yttrium fluoride, the particle size of the yttrium compound tends to easily change due to particle collapse of the yttrium compound with generating fine particles. Further in case that an yttrium compound containing carbon, particularly, the yttrium organic acid salt is used, carbon may remain in a thermal sprayed film formed from the thermal spray material, and in that case, a blackish thermal sprayed film is formed. According to these reasons, and from the viewpoint that it is easy to obtain a commercial product having a desired average particle size ($D_{50}$), the composite particles containing the yttrium oxide and the double salt of ammonium yttrium fluoride are most preferable.

A commercial product may be used for the particles of the yttrium oxide. Here, an average particle size ($D_{50}$) of the particles of the yttrium oxide is preferably not less than 0.1

μm, and more preferably not less than 0.8 μm. On the other hand, an upper limit of the average particle size ($D_{50}$) of the particles of the yttrium oxide is preferably not more than 100 μm, more preferably not more than 60 μm. In case of the crystallization method, fluorine ions and ammonium ions react to the yttrium oxide at its surface, which includes a surface located inside of the particle (inner surface) connecting to an outer surface of the particle other than the outer surface of the particle, while consuming the yttrium oxide, and the particles of the double salt that have mainly sizes of sub-micron are precipitated on the surface and interior of the yttrium oxide which is a matrix. Therefore, the composite particles obtained by the crystallization method have a similar shape derived from the shape of the original yttrium oxide particles, and the particle size is slightly increased with maintaining the original shape of the yttrium oxide particles. It is preferable that an average particle size ($D_{50}$) of the yttrium oxide particles provided to the reaction (crystallization) is about 10 to 40% smaller than an average particle size ($D_{50}$) of the obtained composite particles.

Examples of the aqueous solutions containing fluorine ions and ammonium ions include aqueous solutions of ammonium fluoride compounds such as ammonium fluoride and ammonium hydrogen fluoride. A molar ratio of ammonium ions to fluoride ions ($NH4^+/F^-$) in the aqueous solution containing fluorine ions and ammonium ions, of not less than 1/7 is necessary to form the double salt of ammonium yttrium fluoride, however, the ratio is preferably not less than 1/5, more preferably not less than 1/3 since the higher ratio of ammonium ions proceeds the reaction. From the viewpoint of good productivity, dissolution and reaction for forming the double salt may be simultaneously proceeded to obtain the composite particles by adding ammonium fluoride or ammonium hydrogen fluoride as a solid (particles) into a slurry of yttrium oxide dispersed in water.

When the particle of the yttrium oxide has a particle diameter of, for example, more than 15 μm, the central portion of the particle is hard to reacted. In order to reach the reaction sufficiently to the central portion of the particle, a reaction temperature of the particles of the yttrium oxide with fluorine ions and ammonium ions (a crystallization temperature of the double salt of ammonium yttrium fluoride) is preferably not less than 50° C., more preferably not less than 60° C. An upper limit of the reaction temperature (crystallization temperature) is preferably not more than 100° C., more preferably not more than 80° C. from the viewpoint of suppressing vaper of ammonia which is a by-product, or avoiding boiling of the reaction solution (crystallization solution). Drying of the composite particles obtained by such a manner is necessary to be performed at a temperature that does not casus reaction or decomposition of the double salt of ammonium yttrium fluoride in the composite particles, therefore, the drying is performed at a temperature of preferably less than 200° C., more preferably not more than 100° C.

The composite particles of the second embodiment, particularly the composite particles obtained by the crystallization method, tend to have a structure in which the double salt of ammonium yttrium fluoride is more finely dispersed in the composite particles, and HF gas and $NH_3$ gas generated by the thermal decomposition are efficiently dispersed during thermal spraying in air. In this case, it is preferable than the composite particles of the first embodiment since less HF gas is lost to the outside of reaction system without reaction with the yttrium oxide, and effect of preventing the oxidation of yttrium oxyfluoride (effect of preventing the oxidation of yttrium oxyfluoride by consuming oxygen in the surrounding air) is more likely to be obtained.

When a thermal sprayed film is formed by thermal spraying in air with using the thermal spray material including the composite particles of the present invention, a thermal sprayed film containing an yttrium oxyfluoride, typically, a thermal sprayed film having a desired composition, particularly, a desired molar ratio of F and Y (F/Y) can be formed. The molar ratio of F and Y (F/Y) in the thermal sprayed film containing an yttrium oxyfluoride is preferably not less than 1, more preferably not less than 1.1. On the other hand, an upper limit of the molar ratio of F and Y (F/Y) is preferably less than 3, more preferably not more than 2.9.

EXAMPLES

To illustrate the invention in detail, Examples and Comparative Examples are given below, however, the invention is not limited by the following Examples. Here, properties of the particles of yttrium oxide as a raw material, the thermal spray material containing composite particles, and the thermal sprayed film formed with using the thermal spray material were measured and evaluated by the method described below.

[Measurement of Average Particle Size ($D_{50}$)]

The average particle size ($D_{50}$) was measured by a laser diffraction/scattering type particle size distribution analyzer Microtrac MT3300 EXII type, manufactured by Nikkiso Co., Ltd. In particular, an about 0.1 g of a sample was added into 40 ml of pure water contained in a 50 ml beaker, and ultrasonic dispersion for loosening weak adhesion between particles was performed at an output of 40 W for 1 minute, and then the dispersion liquid was putted into the apparatus.

[Evaluation of Particle Shape]

The shape of the particles was observed by a scanning electron microscope (SEM).

[Evaluation of Constituents]

The components contained in the raw material or the thermal spray material were analyzed by X-ray diffraction (XRD).

[Determination of Amounts of F and Y Contained in Thermal Spray Material and Thermal Sprayed Film, and Evaluation of F/Y (Molar Ratio)]

With respect to an yttrium content, the thermal spray material or the thermal sprayed film was dissolved with a mixed acid of nitric acid and perchloric acid to obtain an aqueous solution, and the yttrium content was determined by EDTA titration method using the obtained aqueous solution. With respect to a fluorine content, an aqueous solution of the thermal spray material or the thermal sprayed film was prepared by alkaline melting method, and the fluorine content was determined by ion chromatography. A F/Y (molar ratio) was calculated from these results of analysis.

[Film Forming Test of Thermal Spray Material]

A substrate of aluminum alloy (A6061) of 100 mm-square (5 mm-thick) was prepared, and the obtained thermal spray material was sprayed onto the substrate by an atmospheric plasma spraying device to form yttrium oxyfluoride-based film having a thickness of about 200 μm. Argon gas and hydrogen gas were used as plasma gases, and a power of 40 kW, a thermal spraying distance of 100 mm, and a 30 μm/pass were set as thermal spraying conditions.

Example 1

1,129 g (Y=10 mol) of yttrium oxide ($Y_2O_3$) particles (manufactured by Shin-Etsu Chemical Co., Ltd., average particle size ($D_{50}$)=9.1 μm) was dispersed into 4.0 L of pure water to form a slurry. Next, 519 g (F=14 mol) of ammonium fluoride ($NH_4F$) was promptly added into the slurry and solved, to crystallize double salt of ammonium yttrium fluoride at the surface and interior of the yttrium oxide particles while aging at 60° C. for 3 hours. The obtained particles were filtrated and washed with water, then dried at 80° C., and loosen through a sieve having an opening of 75 μm to obtain a thermal spray material which consists of composite particles containing the yttrium oxide and the ammonium yttrium fluoride double salt.

The obtained thermal spray material (composite particles) had an average particle size ($D_{50}$) of 12.3 μm. In this case, the yttrium oxide particles as the raw material had an average particle size ($D_{50}$) smaller than the average particle size ($D_{50}$) of the obtained thermal spray material (composite particles) by about 26%. The thermal spray material had an F/Y (molar ratio) of 1.38 which was slightly reduced from the F/Y (molar ratio) of 1.40 of the raw material.

Figure 2:
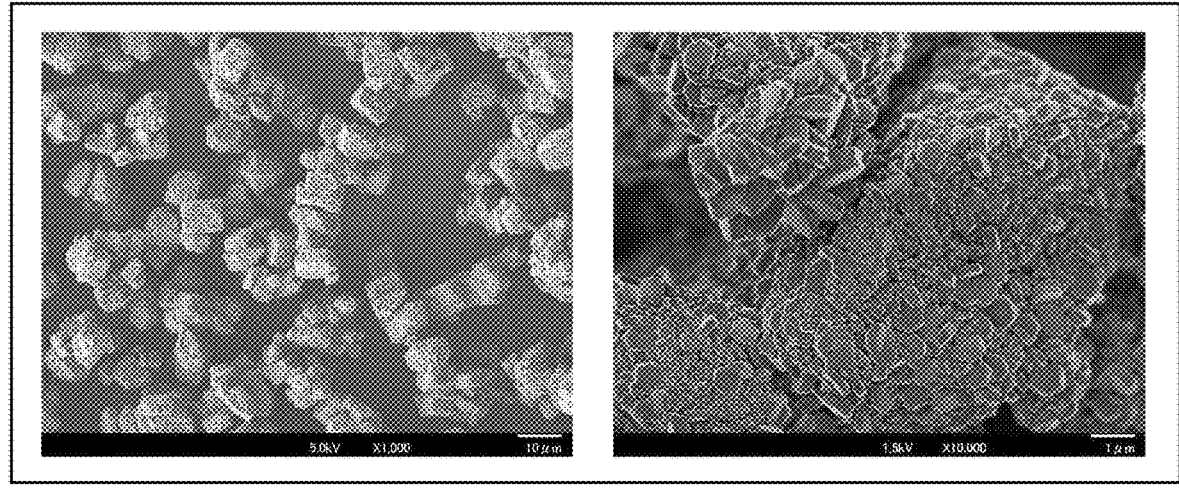
FIG. 2 It is a SEM image of the composite particles obtained in Example 1.

SEM images of the yttrium oxide used as a raw material and the obtained thermal spray material (composite particles) are shown in FIGS. 1 and 2, respectively. In the figures, the left side is an image with a magnification of 1,000 times, and the right side is an image with a magnification of 10,000 times (the same in the following SEM images). From the SEM image, in the obtained composite particles, it was confirmed that the state in which hexagonal plate-shaped double salts of ammonium yttrium fluoride, precipitated by consumption and reaction of the yttrium oxide particles, are uniformly dispersed on the surface and interior of the yttrium oxide particles. The shape of the composite particles was derived from and similar to that of the yttrium oxide particles as a raw material.

Figure 3:
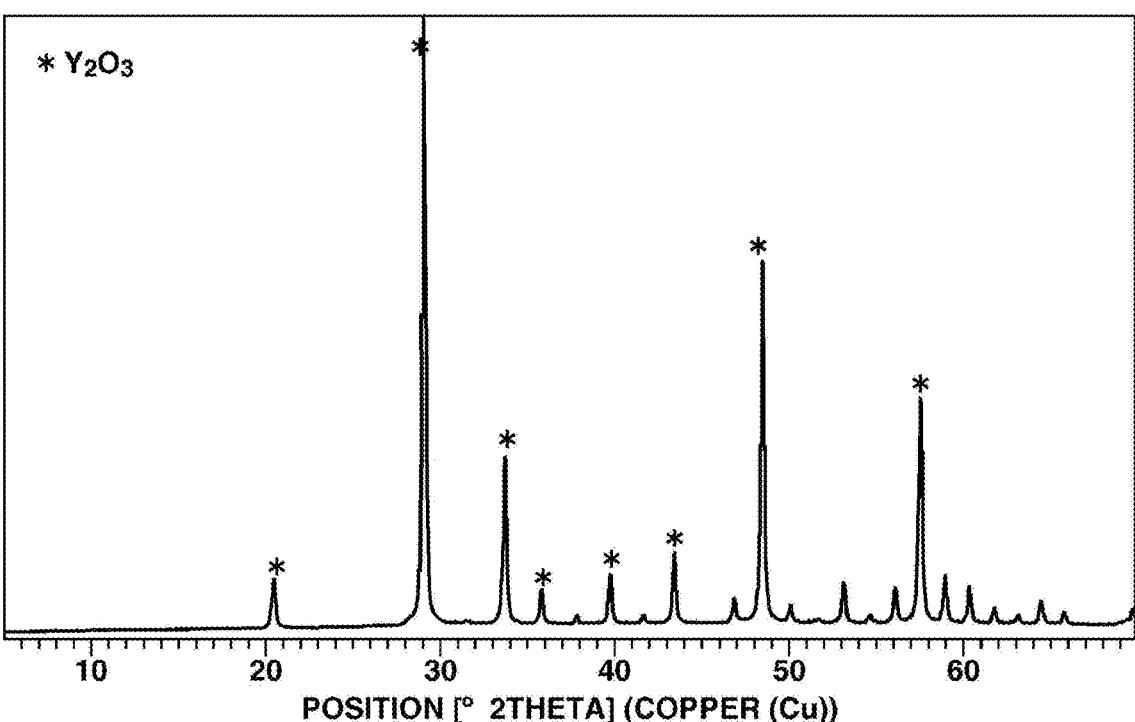
FIG. 3 It is an XRD profile of the yttrium oxide used in Example 1.
Figure 4:
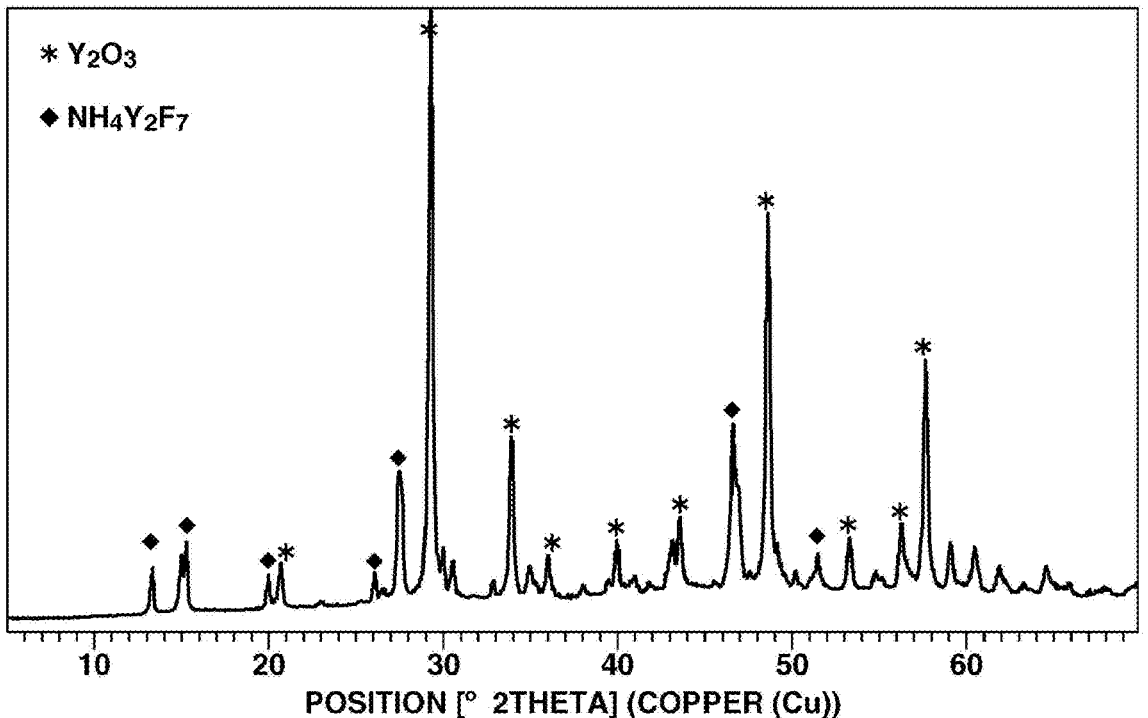
FIG. 4 It is an XRD profile of the composite particles obtained in Example 1.

XRD profiles of the yttrium oxide used as a raw material and the obtained thermal spray material (composite particles) are shown in FIGS. 3 and 4, respectively. From analysis of XRD, it was found that the obtained spray material (composite particles) contains, as crystal phases, yttrium oxide ($Y_2O_3$) and double salt of ammonium yttrium fluoride ($NH_4Y_2F_7$), and is free of yttrium fluoride ($YF_3$).

The thermal sprayed film formed by thermal spraying of the obtained thermal spray material had an F/Y (molar ratio) of 1.35. Assuming that the F/Y in the raw material is 100%, a retention ratio in the formed thermal sprayed film is 1.35/1.40×100=96.4%, and it was found that the composition (F/Y) of the thermal sprayed film is close to the composition (F/Y) of the thermal spray material, further close to the composition (F/Y) of the raw material, loss of fluorine is reduced, and the composition of the raw material is reflected in the composition of the thermal sprayed film.

Examples 2 and 3

Thermal spray materials were obtained by the same manner as in Example 1 except that amounts of pure water and ammonium fluoride ($NH_4F$) were changed to the amounts described in Table 1; the properties were measured and evaluated by the same manner as in Example 1. The results are shown in Table 1.

Example 4

Thermal spray material was obtained by the same manner as in Example 1 except that an amount of pure water was changed to the amount described in Table 1, a 1,129 g (Y=10 mol) of yttrium oxide ($Y_2O_3$) particles (manufactured by Shin-Etsu Chemical Co., Ltd., average particle size ($D_{50}$)

=18.4 μm, which is larger than the average particle size of the yttrium oxide particles used in Example 1) was used, and a 339 g (F=14 mol) of ammonium hydrogen fluoride ($NH_4FHF$) was used instead of ammonium fluoride ($NH_4F$); the properties were measured and evaluated by the same manner as in Example 1. The results are shown in Table 1.

Example 5

Thermal spray material was obtained by the same manner as in Example 1 except that an amount of pure water was changed to the amount described in Table 1, a 1,129 g (Y=10 mol) of yttrium oxide ($Y_2O_3$) particles (manufactured by Shin-Etsu Chemical Co., Ltd., average particle size ($D_{50}$) =51.0 μm, which is larger than the average particle size of the yttrium oxide particles used in Example 4) was used, and a 428 g (F=15 mol) of ammonium hydrogen fluoride ($NH_4FHF$) was used instead of ammonium fluoride ($NH_4F$); the properties were measured and evaluated by the same manner as in Example 1. The results are shown in Table 1.

Example 6

Thermal spray material was obtained by the same manner as in Example 1 except that an amount of pure water was changed to the amount described in Table 1, a 1,129 g (Y=10

Comparative Example 1

Figure 5:
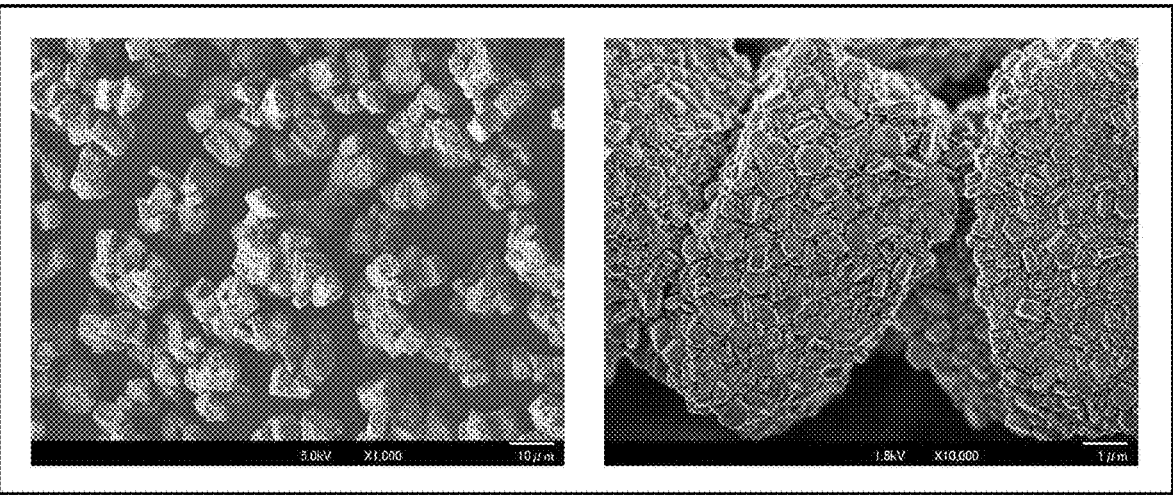
FIG. 5 It is a SEM image of the particles obtained in Comparative Example 1.

A thermal spray material obtained by the same manner as in Example 1 was further calcined at 500° C. in air to obtain a thermal spray material to which the yttrium oxide ($Y_2O_3$) and the double salt of ammonium yttrium fluoride had reacted; the properties were measured and evaluated by the same manner as in Example 1. The results are shown in Table 1. A SEM image of the obtained thermal spray material (particles) is shown in FIG. 5.

Figure 6:
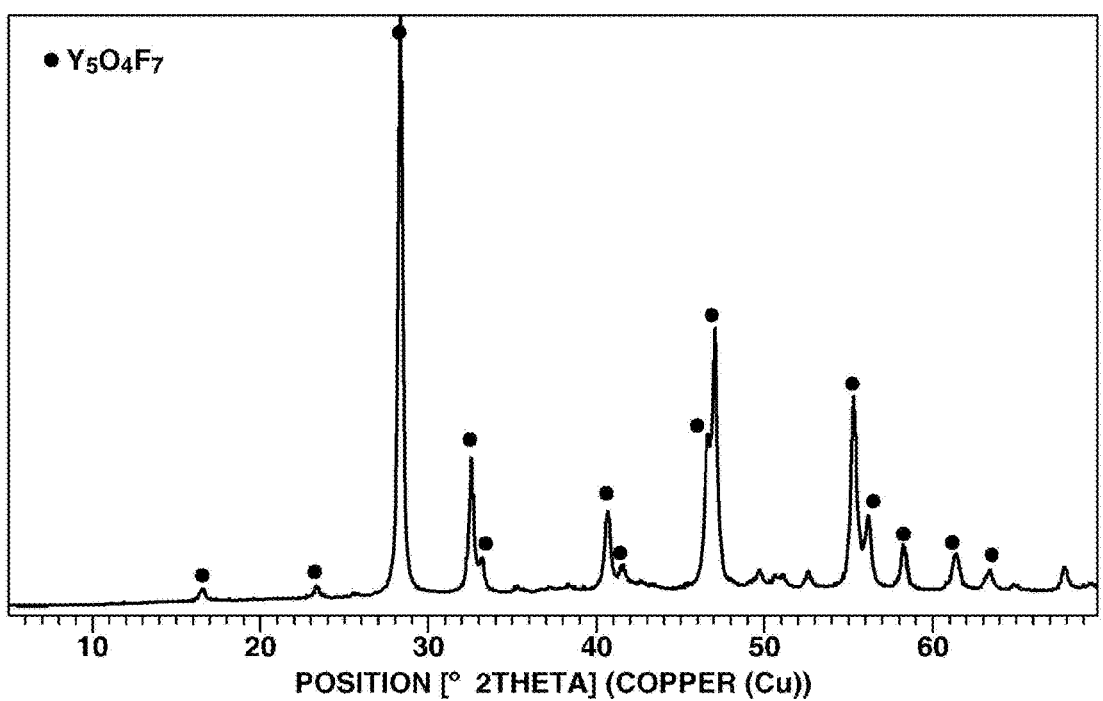
FIG. 6 It is an XRD profile of the particles obtained in Comparative Example 1.

Further, an XRD profile of the obtained thermal spray material (particles) is shown in FIG. 6. From analysis of XRD, it was found that the obtained spray material contains, as crystal phase, yttrium oxyfluoride ($Y_5O_4F_7$) generated by reaction of the yttrium oxide ($Y_2O_3$) and the double salt of ammonium yttrium fluoride ($NH_4Y_2F_7$) and is free of the yttrium oxide and the double salt of ammonium yttrium fluoride.

In the case of Comparative Example 1, assuming that the F/Y in the raw material is 100%, a retention ratio in the formed thermal sprayed film is 87.9%, and it was found that the composition (F/Y) of the thermal sprayed film is apart from the composition (F/Y) of the raw material, and the composition of the raw material is not reflected in the composition of the thermal sprayed film.

TABLE 1

| | | Raw material | | | | | | | Thermal spray material | | Thermal sprayed film | Retention ratio Raw material |
|---|---|---|---|---|---|---|---|---|---|---|---|---|
| | | | | | | Ammonium fluoride compound | | | | | | to Thermal |
| | Pure | Yttrium oxide | | | | | | F/Y | F/Y | | F/Y | |
| | Water [L] | $D_{50}$ [μm] | Weight [g] | Y [mol] | Kind of Compound | Weight [g] | F [mol] | [molar ratio] | [molar ratio] | $D_{50}$ [μm] | [molar ratio] | sprayed film [%] |
| Example 1 | 4.0 | 9.1 | 1129 | 10 | $NH_4F$ | 519 | 14 | 1.40 | 1.38 | 12.3 | 1.35 | 96.4 |
| Example 2 | 3.8 | 9.1 | 1129 | 10 | $NH_4F$ | 667 | 18 | 1.80 | 1.79 | 12.5 | 1.76 | 97.8 |
| Example 3 | 3.7 | 9.1 | 1129 | 10 | $NH_4F$ | 815 | 22 | 2.20 | 2.17 | 13.2 | 2.14 | 97.3 |
| Example 4 | 4.1 | 18.4 | 1129 | 10 | $NH_4FHF$ | 399 | 14 | 1.40 | 1.34 | 21.4 | 1.34 | 95.7 |
| Example 5 | 4.1 | 51.0 | 1129 | 10 | $NH_4FHF$ | 428 | 15 | 1.50 | 1.47 | 52.4 | 1.46 | 97.3 |
| Example 6 | 4.1 | 2.3 | 1129 | 10 | $NH_4FHF$ | 713 | 25 | 2.50 | 2.45 | 3.7 | 2.40 | 96.0 |
| Comparative Example 1 | 4.0 | 9.1 | 1129 | 10 | $NH_4F$ | 519 | 14 | 1.40 | 1.35 | 11.3 | 1.23 | 87.9 | mol) of yttrium oxide ($Y_2O_3$) particles (manufactured by Shin-Etsu Chemical Co., Ltd., average particle size ($D_{50}$) =2.3 μm, which is smaller than the average particle size of the yttrium oxide particles used in Example 1) was used, and a 713 g (F=25 mol) of ammonium hydrogen fluoride ($NH_4FHF$) was used instead of ammonium fluoride ($NH_4F$); the properties were measured and evaluated by the same manner as in Example 1. The results are shown in Table 1.

Also in the cases of Examples 2 to 6, assuming that the F/Y in the raw material is 100%, each retention ratio in the formed thermal sprayed film is within 95.7 to 97.8%, and it was found that the composition (F/Y) of the thermal sprayed film is close to the composition (F/Y) of the thermal spray material, further close to the composition (F/Y) of the raw material, loss of fluorine is reduced, and the composition of the raw material is reflected in the composition of the thermal sprayed film.

The invention claimed is:

1. A thermal spray material comprising composite particles consisting of an yttrium oxide and $NH_4Y_2F_7$ as crystal phases.

2. The thermal spray material of claim 1 wherein a molar ratio of F to Y (F/Y) in the composite particles is not less than 1 and less than 3.

3. The thermal spray material of claim 1 having an average particle size ($D_{50}$) of not less than 1 μm and not more than 100 μm.

4. The thermal spray material of claim 1 comprising the composite particles of not less than 50 wt %.

* * * * *